United States Patent
Bell et al.

(10) Patent No.: US 9,485,888 B2
(45) Date of Patent: Nov. 1, 2016

(54) COOLING SYSTEM FOR USE IN A MASS STORAGE CHASSIS ASSEMBLY

(71) Applicant: HGST Netherlands B.V., Amsterdam (NL)

(72) Inventors: Michael S. Bell, Colorado Springs, CO (US); Jeffrey D. Wilke, Palmer Lake, CO (US)

(73) Assignee: HGST Netherlands B.V., Amsterdam (NL)

( * ) Notice: Subject to any disclaimer, the term of this patent is extended or adjusted under 35 U.S.C. 154(b) by 69 days.

(21) Appl. No.: 14/489,468

(22) Filed: Sep. 18, 2014

(65) Prior Publication Data

US 2016/0088766 A1    Mar. 24, 2016

(51) Int. Cl.
*H05K 7/20* (2006.01)
*G11B 33/12* (2006.01)
*G11B 33/14* (2006.01)

(52) U.S. Cl.
CPC ......... *H05K 7/20172* (2013.01); *G11B 33/128* (2013.01); *G11B 33/142* (2013.01); *H05K 7/20736* (2013.01)

(58) Field of Classification Search
CPC ............ H05K 7/20172; H05K 7/20736; G11B 33/142; G11B 33/128
USPC .......... 361/679.46–679.54, 688–723
See application file for complete search history.

(56) References Cited

U.S. PATENT DOCUMENTS

| | | | |
|---|---|---|---|
| 5,717,570 A | 2/1998 | Kikinis | |
| 6,556,437 B1 * | 4/2003 | Hardin | H05K 7/20172 361/679.48 |
| 6,567,271 B2 | 5/2003 | Stone et al. | |
| 7,349,205 B2 | 3/2008 | Hall et al. | |
| 7,495,906 B2 | 2/2009 | Fujie et al. | |
| 8,473,779 B2 | 6/2013 | Siewert et al. | |
| 2004/0130872 A1 * | 7/2004 | Cravens | H05K 7/20727 361/695 |
| 2004/0145881 A1 * | 7/2004 | Kosugi | F04D 29/601 361/810 |
| 2005/0278927 A1 * | 12/2005 | Campbell | F04D 29/601 29/453 |
| 2008/0014093 A1 * | 1/2008 | Fan | F04D 29/601 416/244 R |
| 2008/0239665 A1 * | 10/2008 | Franz | F04D 29/646 361/695 |
| 2009/0034191 A1 * | 2/2009 | Yin | F04D 25/0613 361/695 |
| 2012/0148397 A1 * | 6/2012 | Tsai | F03D 11/00 415/213.1 |
| 2012/0243170 A1 | 9/2012 | Frink et al. | |
| 2013/0064650 A1 * | 3/2013 | Wang | G06F 1/20 415/182.1 |
| 2014/0085810 A1 * | 3/2014 | Xu | H05K 7/1492 361/679.48 |
| 2014/0198451 A1 * | 7/2014 | Kuo | G01K 1/026 361/695 |

OTHER PUBLICATIONS inXtron "Taurus RAID II", Multi-Bay RAID Enclosures products, Retrieved at http://www.inxtron.com/multi-bay-raid-enclosures/taurus-raid2 on Sep. 16, 2014, 3 pages.

* cited by examiner

*Primary Examiner* — Anthony Haughton
*Assistant Examiner* — Yahya Ahmad (57) ABSTRACT

A cooling system for use in a mass storage chassis assembly is provided. The cooling system in one example includes a frame including one or more fan bays for receiving one or more fan units, one or more fan bay connectors located in the one or more fan bays and configured to couple to and provide electrical power to the one or more fan units, a plurality of retainer devices positioned in each fan bay, with the plurality of retainer devices configured to receive and hold a plurality of projections extending from each fan unit, and the one or more fan units configured to be installed to the one or more fan bays, with each fan unit including a fan connector that couples to the corresponding fan bay connector.

32 Claims, 11 Drawing Sheets

COOLING SYSTEM FOR USE IN A MASS STORAGE CHASSIS ASSEMBLY

BACKGROUND OF THE INVENTION

Field of the Invention

Aspects of the disclosure are related to the field of data storage systems, and in particular, to a mass storage chassis assembly.

Description of the Related Art

Mass storage systems are used for storing enormous quantities of digital data. As computer systems and networks grow in numbers and capability, there is a need for more and more storage system capacity. Cloud computing and large-scale data processing have further increase the need for digital data storage systems that are capable of transferring and holding immense amounts of data.

Mass storage systems are typically formed from a large number of mass storage devices. A mass storage chassis assembly is a modular unit that holds and operates a number of mass storage sub-assemblies. The capacity of a mass storage system can be increased in large increments by the installation of an additional mass storage chassis assembly or assemblies to a rack or other support structure.

Efficiency and ease-of-maintenance are of prime consideration in a mass storage system. It is important that technicians can easily and quickly access and install or service the components of a mass storage system. Further, it is highly desirable that components of a mass storage chassis assembly can be safely accessed by a technician.

SUMMARY OF THE INVENTION

A cooling system for use in a mass storage chassis assembly is provided. The cooling system in one example includes a frame including one or more fan bays for receiving one or more fan units, one or more fan bay connectors located in the one or more fan bays and configured to couple to and provide electrical power to the one or more fan units, a plurality of retainer devices positioned in each fan bay, with the plurality of retainer devices configured to receive and hold a plurality of projections extending from each fan unit, and the one or more fan units configured to be installed to the one or more fan bays, with each fan unit including a fan connector that couples to the corresponding fan bay connector.

DETAILED DESCRIPTION OF THE INVENTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Figure 1:
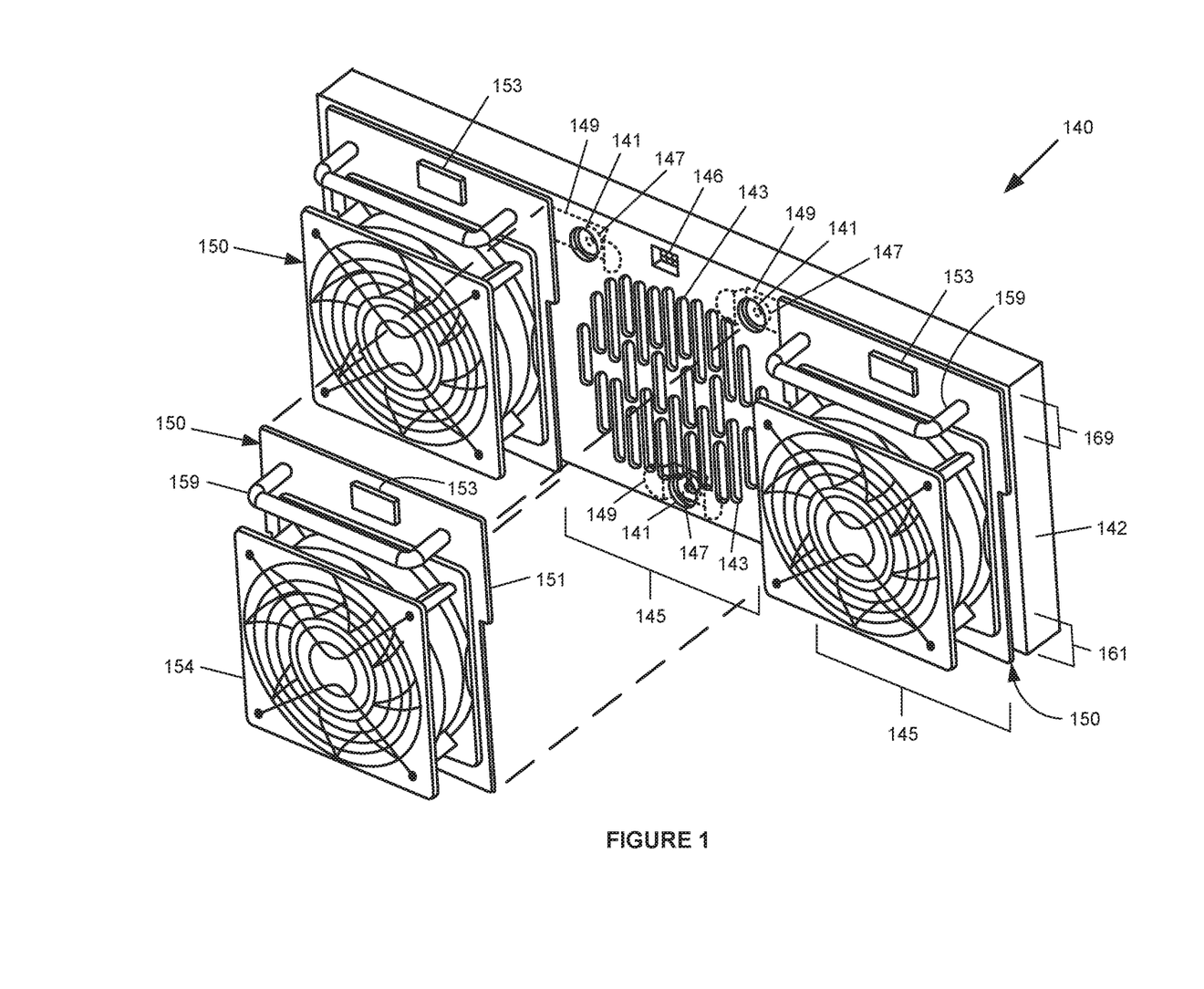
FIG. 1 shows an exemplary cooling system.

FIG. 1 shows an exemplary cooling system 140. The cooling system 140 includes a frame 142 and one or more fan units 150 removably installed to the frame 142. The frame 142 comprises a portion of a chassis tray 110 of a mass storage chassis assembly 100 or is permanently or removably affixed to the chassis tray 110 of the mass storage chassis assembly 100 (see FIGS. 7-8 for example). The cooling system 140 is adapted for use in a tray rear region 112 of a mass storage chassis assembly 100.

The frame 142 includes one or more fan bays 145 for receiving the one or more fan units 150. The one or more fan bays 145 allow manual insertions and removals of fan units 150. The one or more fan bays 145 allow fast and simple insertions and removals of fan units. The one or more fan bays 145 enable fan unit insertion and removal without the need for any fasteners. The one or more fan bays 145 enable fan unit insertion and removal without the need for any tools. The one or more fan bays 145 provide shock and vibration isolation, wherein shocks and vibrations of a fan unit 150 are not transferred to the frame 142 or to the mass storage chassis assembly 100.

A fan bay 145 includes a plurality of bay apertures 143 that form a grill in the frame 142. The plurality of bay apertures 143 substantially correspond to a plurality of airflow apertures 152 of the fan unit 150. Alternatively, the frame 142 can include one or more large openings that allow the corresponding fan unit 150 to move airflow through the frame 142.

Each fan bay 145 includes a fan bay connector 146. The fan bay connector 146 is configured to couple to a corresponding fan connector 153 on the fan unit 150. Electrical power received in the fan unit 150 via the fan connector 146 coupled to the fan bay connector 146 energizes the fan unit 150 to create the airflow. The fan unit 150 can be energized at a predetermined rotational speed or can be operated over a range of rotational speeds. The one or more fan units 150 of the cooling system 140 are configured to be individually or collectively energized by an input/output (I/O) module 115 of the mass storage chassis assembly 100 (see FIG. 7).

The fan bay connector 146 in some examples comprises a floating connector. The fan bay connector 146 is not rigidly coupled to a corresponding sub-assembly bay connector 122 (see FIG. 6) by a device or link that could transfer vibrations to the corresponding sub-assembly bay connector 122. Instead, the fan bay connector 146 is coupled to the corresponding sub-assembly bay connector 122 by an at least partially flexible conductor element 127. The at least partially flexible conductor element 127 comprises at least partially flexible wires, fibers, cables, ribbons, or other conductors that do not transfer vibrations to the sub-assembly bay connectors 122.

Figure 2:
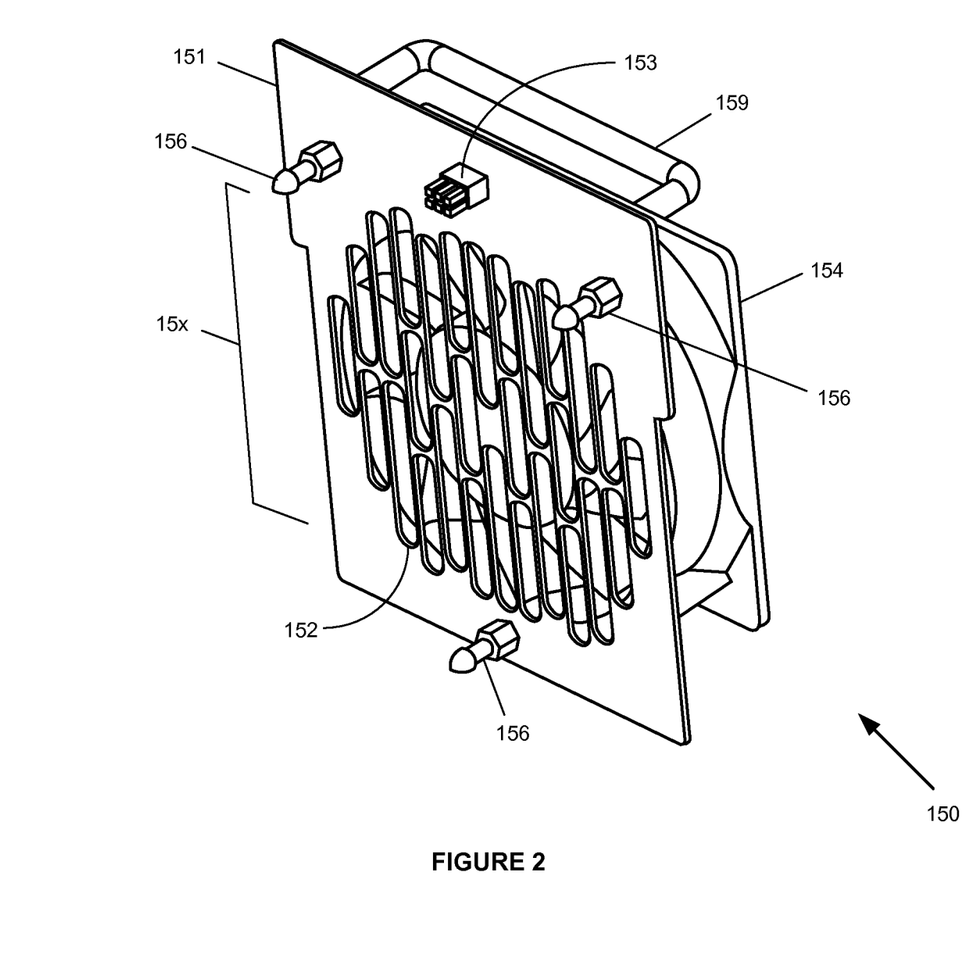
FIG. 2 shows an exemplary fan unit.

Each fan bay 145 includes a plurality of retainer devices 147 configured to receive a corresponding plurality of projections 156 extending from a fan unit 150 (see FIG. 2). The plurality of retainer devices 147 are spaced-apart on the frame 142, within each fan bay 145.

The plurality of retainer devices 147 are affixed to or are a part of the frame 142. In the example shown, the plurality of retainer devices 147 are affixed to retainer brackets 149, wherein the retainer brackets 149 are affixed to the frame 142. Retainer apertures 141 are located to give access to the retainer devices 147. Alternatively, in other examples the retainer devices 147 are received in apertures in the frame 142.

The retainer devices 147 provide a resistance fit or a frictional fit to the corresponding plurality of projections 156 extending from the fan unit 150. As a result, the projections 156 are frictionally retained in the retainer devices 147. The retainer devices 147 require the application of at least a minimum insertion or removal force to insert or remove the plurality of projections 156. In the example shown, the retainer devices 147 comprise three spaced-apart retainer devices 147, with two retainer devices 147 located in an upper bay region 169 of the fan bay 145 and with one retainer devices 147 located in a lower bay region 161 of the fan bay 145.

Alternatively, in other examples the plurality of projections 156 extend from the frame 142, while correspondingly the plurality of retainer devices 147 are coupled to the fan unit 150. The plurality of retainer devices 147 and the plurality of projections 156 still function as previously described to hold a fan unit or units 150 in place with respect to the frame 142. In yet another alternative, each fan unit 150 can have an opposing or random orientation of the plurality of retainer devices 147 and the plurality of projections 156.

The plurality of retainer devices 147 in some examples are formed of an at least partially elastomeric material, such as rubber or rubber-based materials. In some examples, the plurality of retainer devices 147 comprise a plurality of at least partially elastomeric grommets. The at least partially elastomeric plurality of retainer devices 147 resist insertion and removal of the plurality of projections 156. In addition, the at least partially elastomeric plurality of retainer devices 147 dampen shocks and vibrations. Shocks and vibrations generated by the fan unit 150 are not transmitted by the at least partially elastomeric plurality of retainer devices 147 to the frame 142 or to the mass storage sub-assemblies 120.

FIG. 2 shows an exemplary fan unit 150. The fan unit 150 includes a substrate 151, a fan 154 mounted to the substrate 151, a handle 159 affixed to a fan side of the substrate 151, a fan connector 153 extending from a non-fan side of the substrate 151, and a plurality of spaced-apart projections 156 extending from the non-fan side of the substrate 151.

The handle 159 enables a technician to grasp and maneuver the fan unit 150. In addition, the handle 159 provides a visual orientation cue to the technician. When grasping the fan unit 150 by the handle 159, the technician can position the fan unit 150 substantially correctly with respect to a fan bay 145.

The plurality of projections 156 are spaced-apart in positions and distances corresponding to the plurality of retainer devices 147 of the frame 142. The plurality of projections 156 can be subsequently inserted into the plurality of retainer devices 147. The plurality of retainer devices 147 retain the plurality of projections 156 and consequently hold and retain the fan unit 150 in position with respect to the frame 142.

When the plurality of projections 156 are substantially aligned with the plurality of retainer devices 147, the fan connector 153 will be substantially aligned with the corresponding fan bay connector 146. Therefore, as the plurality of projections 156 are pushed into the plurality of retainer devices 147, the fan connector 153 will mate with the corresponding fan bay connector 146.

The substrate 151 further includes a plurality of airflow apertures 152. The airflow apertures 152 correspond to apertures 143 of a fan bay 145.

Figure 3:
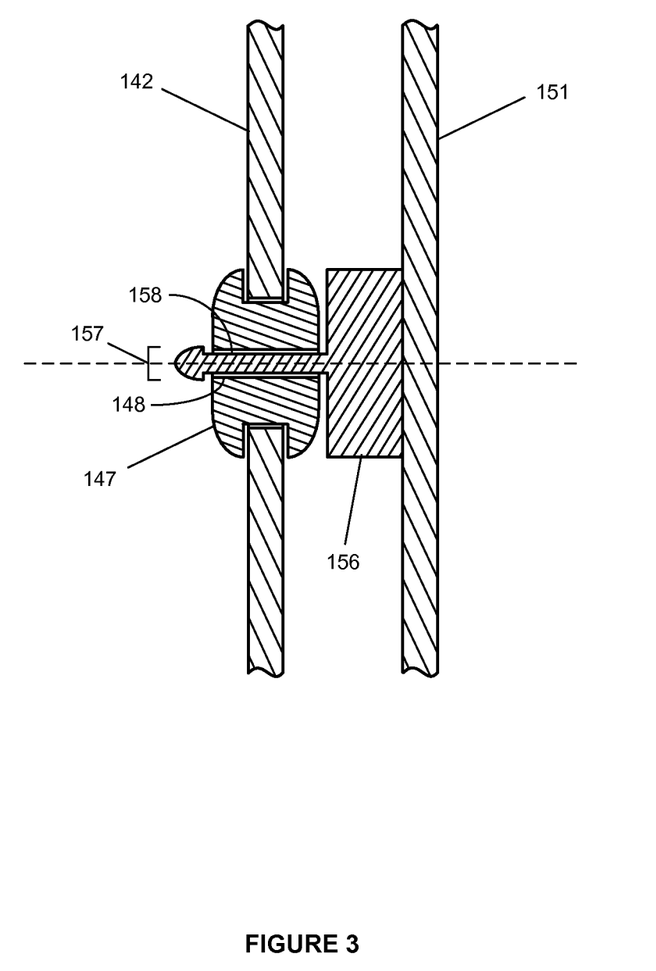
FIG. 3 shows a cross-sectional view of a projection substantially in position in a bore of a retainer device.

FIG. 3 shows a cross-sectional view of a projection 156 substantially in position in a bore 148 of a retainer device 147. The projection 156 in this example comprises a shaft 158 with a head 157 that is enlarged in comparison to the rest of the projection 156. The head 157 in the example shown passes through the retainer device 147 and is located on the far side when the projection 156 is fully inserted into the retainer device 147. The head 157 therefore prevents the projection 156 from moving or working its way back out of the retainer device 147. As previously discussed, the plurality of projections 156 can alternatively extend from the frame 142 and the plurality of retainer devices 147 can be correspondingly coupled to the fan unit 150.

Figure 4:
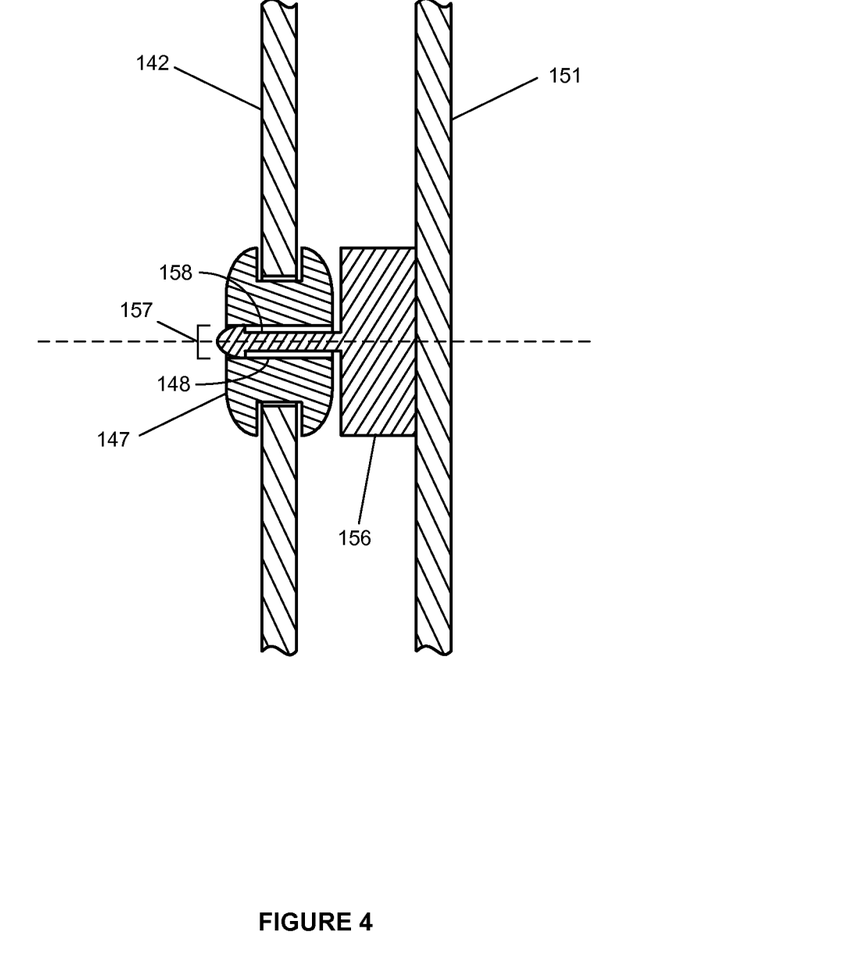
FIG. 4 shows a cross-sectional view of the projection substantially in position in the bore of the retainer device.

FIG. 4 shows a cross-sectional view of the projection 156 substantially in position in the bore 148 of the retainer device 147. In this example, the head 157 of the projection 156 does not pass fully through the retainer device 147. Instead, the head 157 remains within the bore 148 of the retainer device 147. The head 157 therefore remains frictionally restrained by the retainer device 147.

Figure 5:
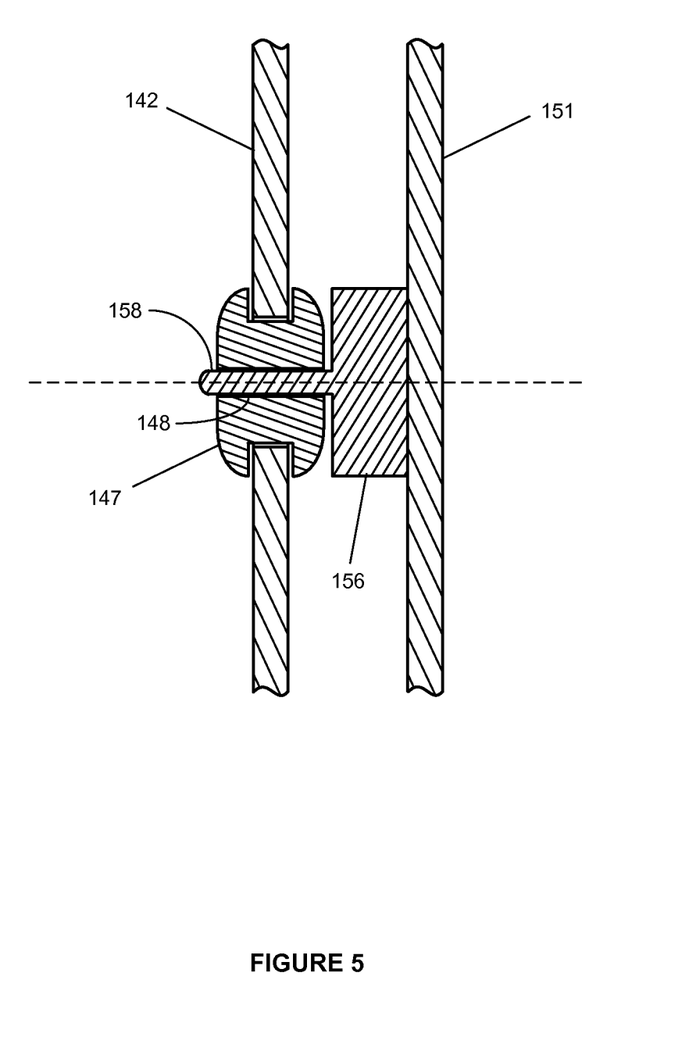
FIG. 5 shows a cross-sectional view of a projection substantially in position in the bore of the retainer device.

FIG. 5 shows a cross-sectional view of a projection 156 substantially in position in the bore 148 of the retainer device 147. The projection 156 in this example comprises only the shaft 158, wherein the projection 156 is substantially uniform along its length, with the projection 156 being large enough in cross-sectional size to engage the bore 148 of the retainer device 147. As previously discussed, the retainer device 147 can comprise an at least partially elastomeric material, wherein the retainer device 147 frictionally engages the projection 156.

Figure 6:
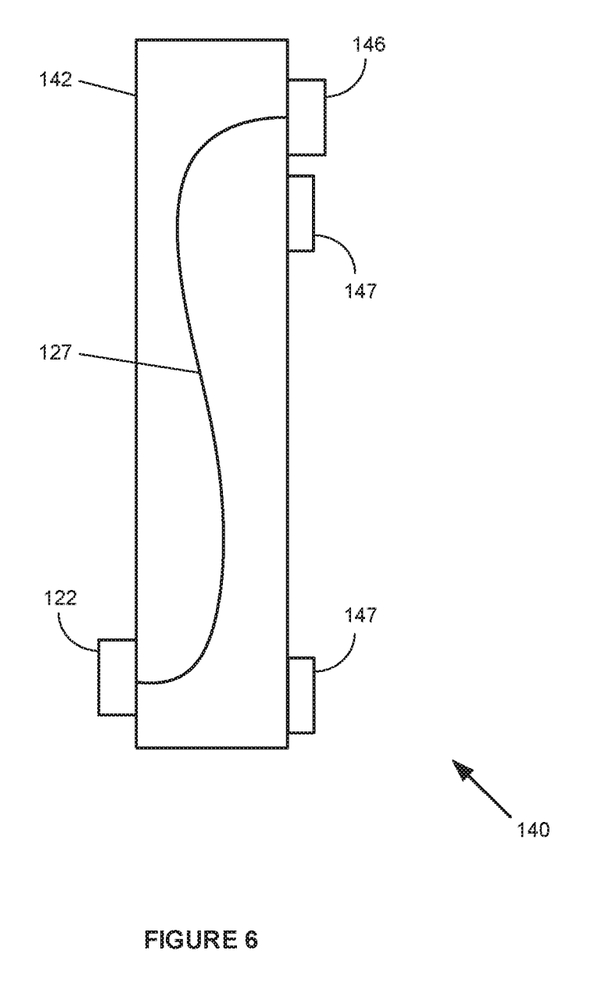
FIG. 6 shows a side view of the cooling system.

FIG. 6 shows a side view of the cooling system 140. The cooling system 140 includes a sub-assembly bay connector 122 on a sub-assembly side of the frame 142, with the cooling system 140 including a sub-assembly bay connector 122 for at least some of the sub-assembly bays of the chassis tray 110. In some examples, the one or more sub-assembly bay connectors 122 correspond to the one or more fan bays 145 and the one or more fan bay connectors 146. The cooling system 140 includes a fan bay connector 146 for each fan bay 145, along with a plurality of retainer devices 147 for each fan bay 145. A fan bay connector 146 is electrically coupled to a corresponding sub-assembly bay connector 122 by an at least partially flexible conductor element 127. The at least partially flexible conductor element 127 comprises one or more flexible wires, fibers, cables, ribbons, or other suitable electrical conductors.

Figure 7:
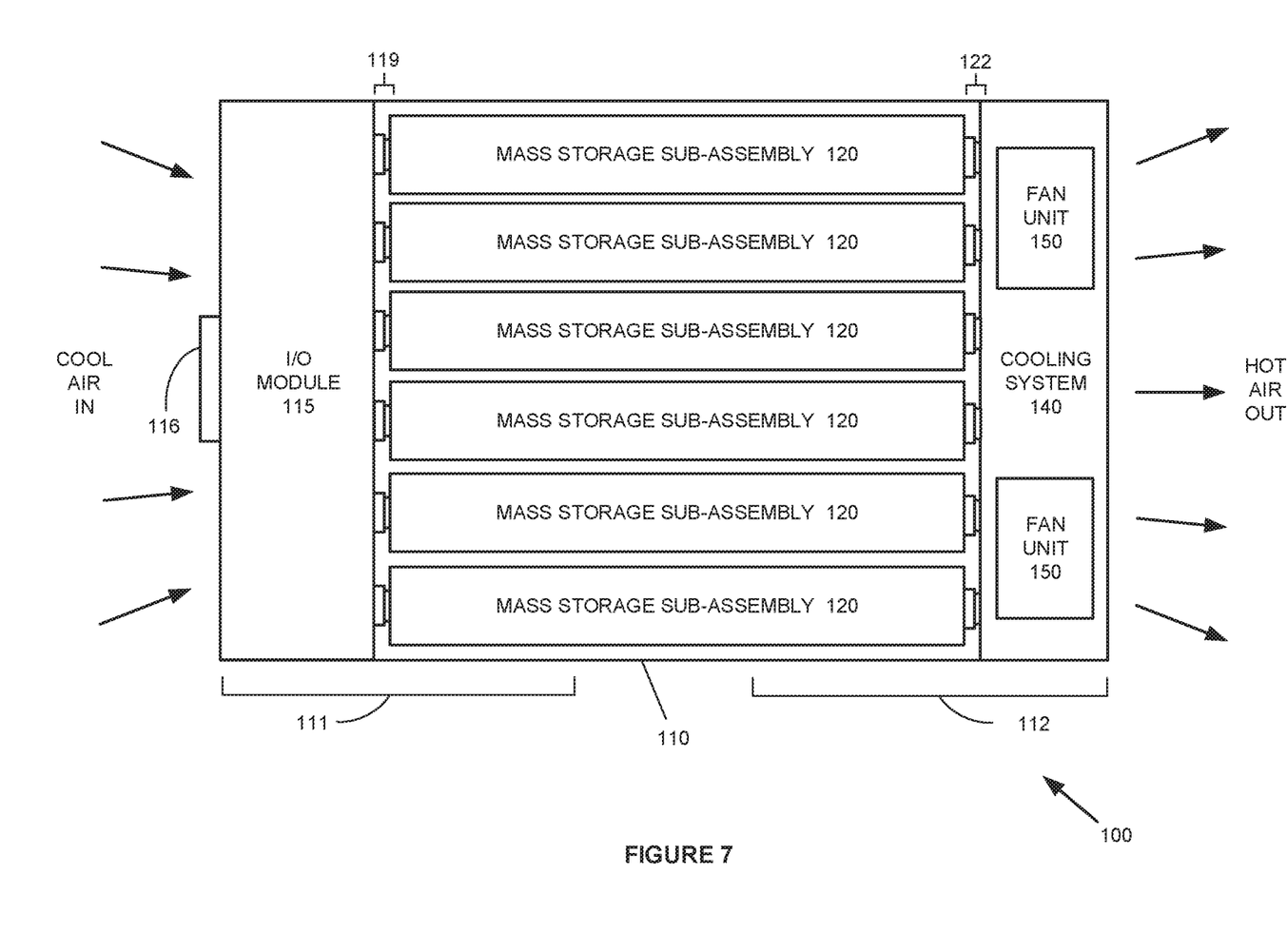
FIG. 7 shows an exemplary cooling system in a mass storage chassis assembly.

FIG. 7 shows an exemplary cooling system 140 in a mass storage chassis assembly 100. The mass storage chassis assembly 100 in the example shown comprises a chassis tray 110, an I/O module 115, and a plurality of mass storage sub-assemblies 120 coupled to the I/O module 115 by sub-assembly front connectors 121 connectors 119. Each mass storage sub-assembly 120 includes one or more digital storage devices, such as Hard Disk Drives (HDDs). An HDD includes one or more spinning disks that operate as digital storage media. The I/O module 115 is electrically coupled to an external network or system via a main I/O connector 116, wherein the mass storage chassis assembly 100 exchanges electrical signals and data between the external network or system and the plurality of mass storage sub-assemblies 120 via the main I/O connector 116. The mass storage chassis assembly 100 further includes the cooling system 140 coupled to one or more of the plurality of mass storage sub-assemblies 120 by sub-assembly rear connectors 122. The cooling system 140 includes the one or more fan units 150 that create airflow.

The chassis tray 110 includes a tray front region 111 and a tray rear region 112. The tray front region 111 is typically positioned at a front aisle region 101 at the front of a support rack 105, while the tray rear region 112 is positioned at a rear aisle region 102 at the rear of the support rack 105 (see FIG. 8). The arrows in the figure show that air is drawn in at the tray front region 111 and is discharged at the tray rear region 112 after traveling substantially through the mass storage chassis assembly 100. As a result, the airflow is drawn through the plurality of mass storage sub-assemblies 120 and cools the plurality of mass storage sub-assemblies 120. In addition, the airflow cools the I/O module 115.

The I/O module 115 in some examples regulates the provision of electrical power to the cooling system 140 and the one or more fan units 150. The I/O module 115 is configured to measure temperatures at one or more locations within the mass storage chassis assembly 100 and regulate fan speeds of the one or more fan units 150.

The airflow is created by the cooling system 140, with the cooling system 140 pulling the airflow through the mass storage chassis assembly 100. The cooling system 140 is located in the tray rear region 112, and exhausts the now-heated air into the rear aisle region 102.

Efficiency and ease-of-maintenance are of prime consideration in a mass storage system. It is important that technicians can easily and quickly access and install or service the components of a mass storage system. Further, it is highly desirable that components of a mass storage chassis assembly can be safely accessed by a technician.

Figure 8:
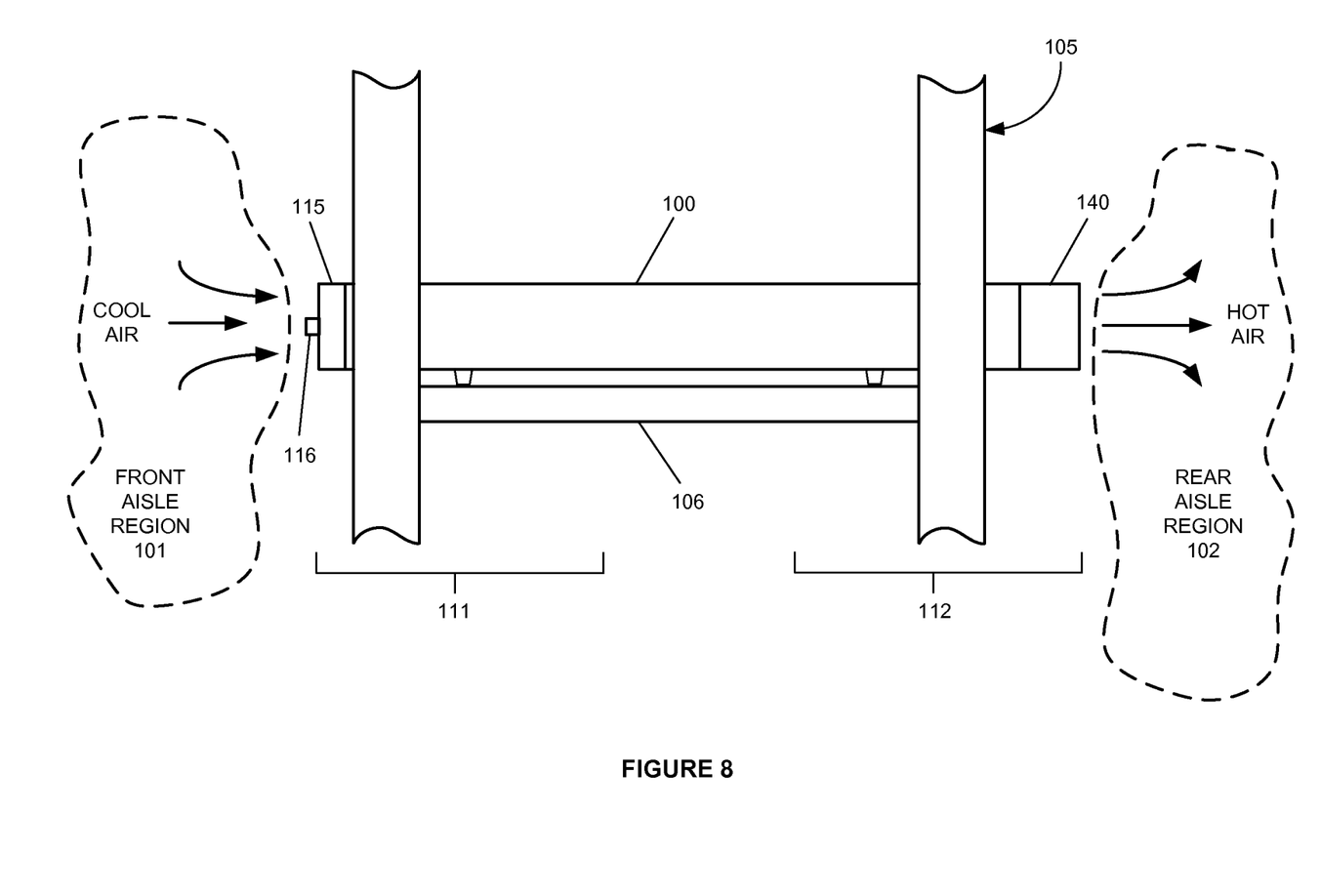
FIG. 8 is a side view of a mass storage chassis assembly in position on a shelf of a support rack.

FIG. 8 is a side view of a mass storage chassis assembly 100 in position on a shelf 106 of a support rack 105. The mass storage chassis assembly 100 is positioned with the I/O module 115 in a front aisle region 101 and with the cooling system 140 in a rear aisle region 102. The mass storage chassis assembly 100 draws air from the front aisle region 101 and exhausts the air into the rear aisle region 102.

The support rack 105 is configured to hold multiple mass storage chassis assemblies 100 in some examples. A large increment of digital mass storage can be added to a digital storage facility by adding a mass storage chassis assembly 100. Multiple mass storage chassis assemblies 100 therefore draw relatively cool air in from the front aisle region 101 and exhaust relatively hot air into the rear aisle region 102. The front aisle region 101 is typically much cooler than a rear aisle region 102, where all cooling air flowing through the installed mass storage chassis assemblies 100 is exhausted. As a consequence, the rear aisle region 102 will have an elevated air temperature level in comparison to the front aisle region 101. Temperatures in the rear aisle region 102 can reach about one hundred and thirty degrees Fahrenheit. Electrical devices operating in the hot air of the rear aisle region 102 can experience shorter operational lives due to the heating. Components of the cooling system 140 can experience such heating, as the airflow will pass last through the cooling system 140.

The cooling system 140 can require maintenance, such as replacing a fan unit or units of the cooling system 140. To replace a fan, a technician must go into the rear aisle region 102. The rear aisle region 102 may be a relatively confined space. The rear aisle region 102 is hot. In some instances, the rear aisle region 102 can be hot enough to hinder a technician's actions or even to pose a health danger to the technician, especially if the technician must spend an extended amount of time in the rear aisle region 102. Therefore, it is important that service or replacement of components of the cooling system 140 be easy to access and be configured for simple and quick removal and replacement. Further, the components of the cooling system 140 should not require multiple removal/installation steps and should not require multiple tools, complex tools, or any tools at all.

However, a mounting system cannot sacrifice performance for quick and simple removal and replacement. Cooling fans, because they have moving parts, generate vibrations. Such vibrations cannot be allowed to be transmitted into the mass storage sub-assemblies 120 of the mass storage chassis assembly 100. Vibrations transmitted into the mass storage sub-assemblies 120 can negatively impact the performance and operations of the storage devices within the mass storage sub-assemblies 120. Vibrations can affect read head tracking of a spinning disk medium and therefore can slow or hinder data transfers. Vibrations can also cause fatigue and physical damage to the components of the mass storage sub-assemblies 120.

Figure 9:
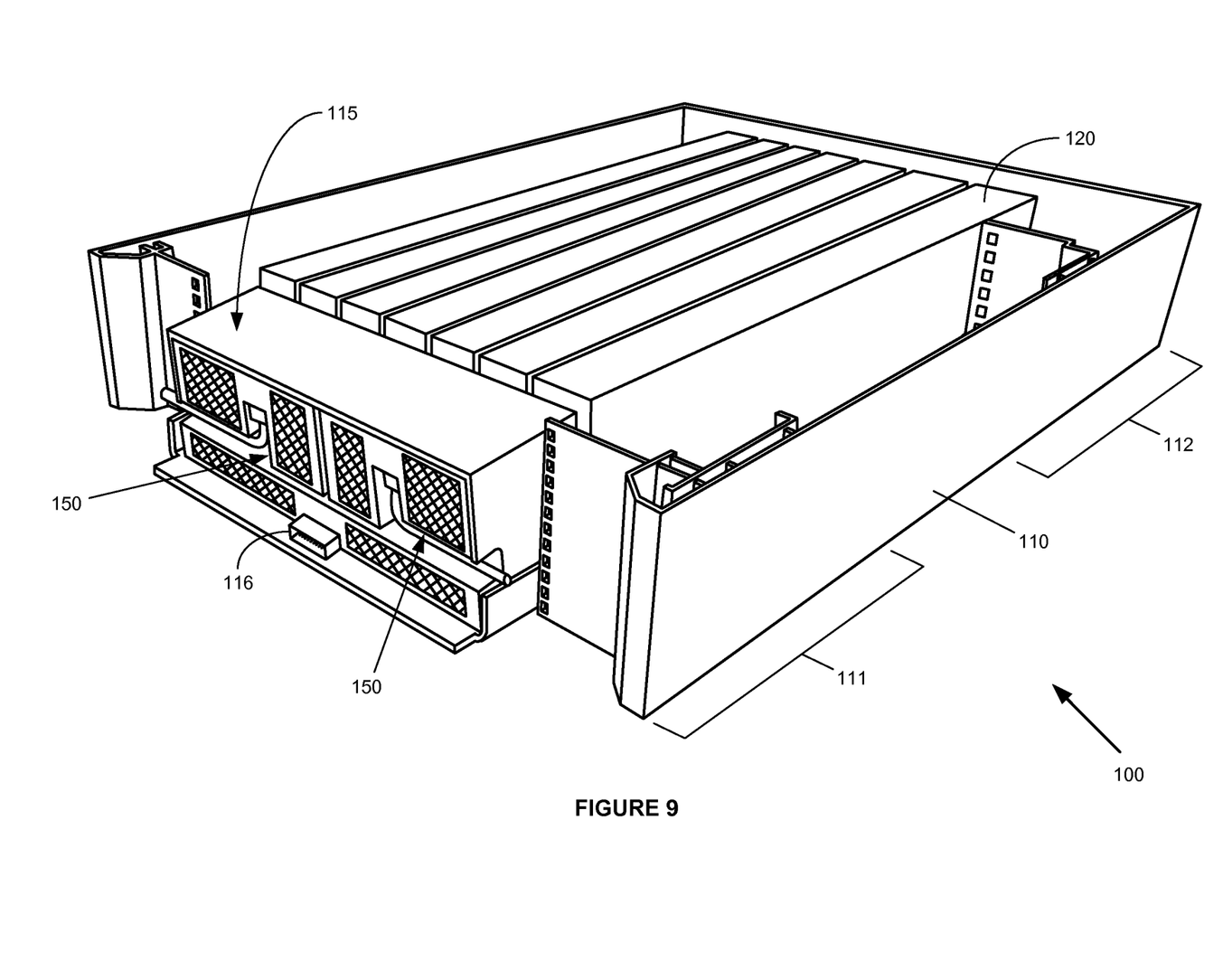
FIG. 9 shows an exemplary mass storage chassis assembly.

FIG. 9 shows an exemplary mass storage chassis assembly 100. The mass storage chassis assembly 100 includes a chassis tray 110 having the tray front region 111 and the tray rear region 112. The chassis tray 110 receives the one or more mass storage sub-assemblies 120. The I/O module 115 is positioned at the front of the chassis tray 110 and is electrically coupled to the one or more mass storage sub-assemblies 120. The one or more mass storage sub-assemblies 120 extend substantially from the tray front region 111 to the tray rear region 112. The cooling unit 140 (not shown) is affixed to the rear wall of the chassis tray 110 or comprises the rear wall.

Figure 10:
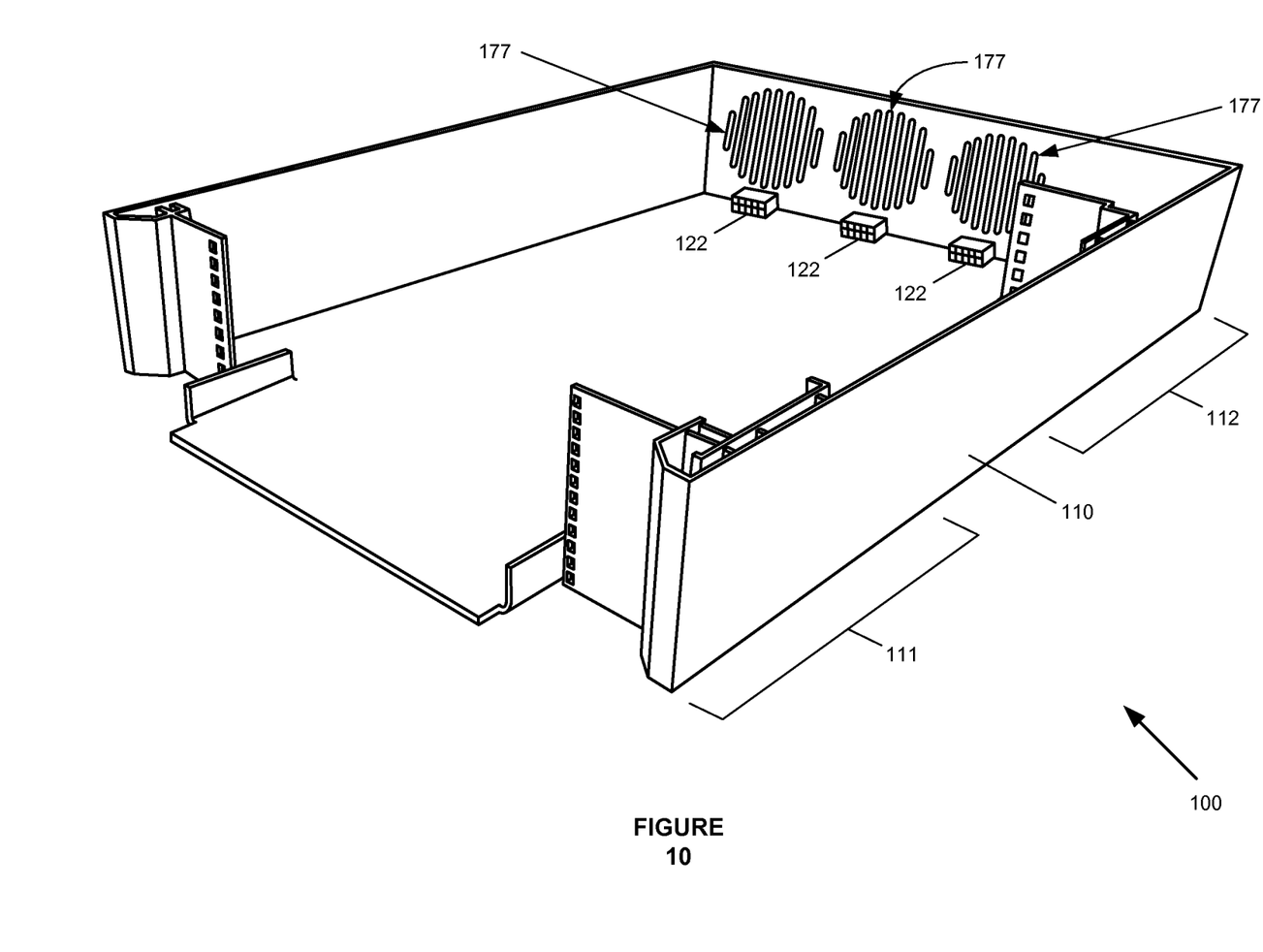
FIG. 10 shows the chassis tray without the I/O module installed and without any mass storage sub-assemblies installed.

FIG. 10 shows the chassis tray 110 without the I/O module 115 installed and without any mass storage sub-assemblies 120 installed. In this example, the chassis tray 110 includes three airflow grills 177. The airflow grills 177 will substantially match up to the slots 143 of the cooling system 140 in some examples. In other examples, the airflow grills 177 comprise the slots 143 of each fan bay 145. The airflow grills 177 also substantially match up to the airflow apertures 152 of the substrate 151 of a fan unit 150.

The figure also shows a plurality of sub-assembly bay connectors 122. Sub-assembly bays in the chassis tray 110 can include corresponding sub-assembly bay connectors 122 in some examples. A mass storage sub-assembly 120 installed in the chassis tray 110 can couple to a corresponding sub-assembly bay connector 122. However, it should be understood that not all mass storage sub-assemblies 120 installed in the chassis stray 110 may include a corresponding sub-assembly bay connector 122.

Figure 11:
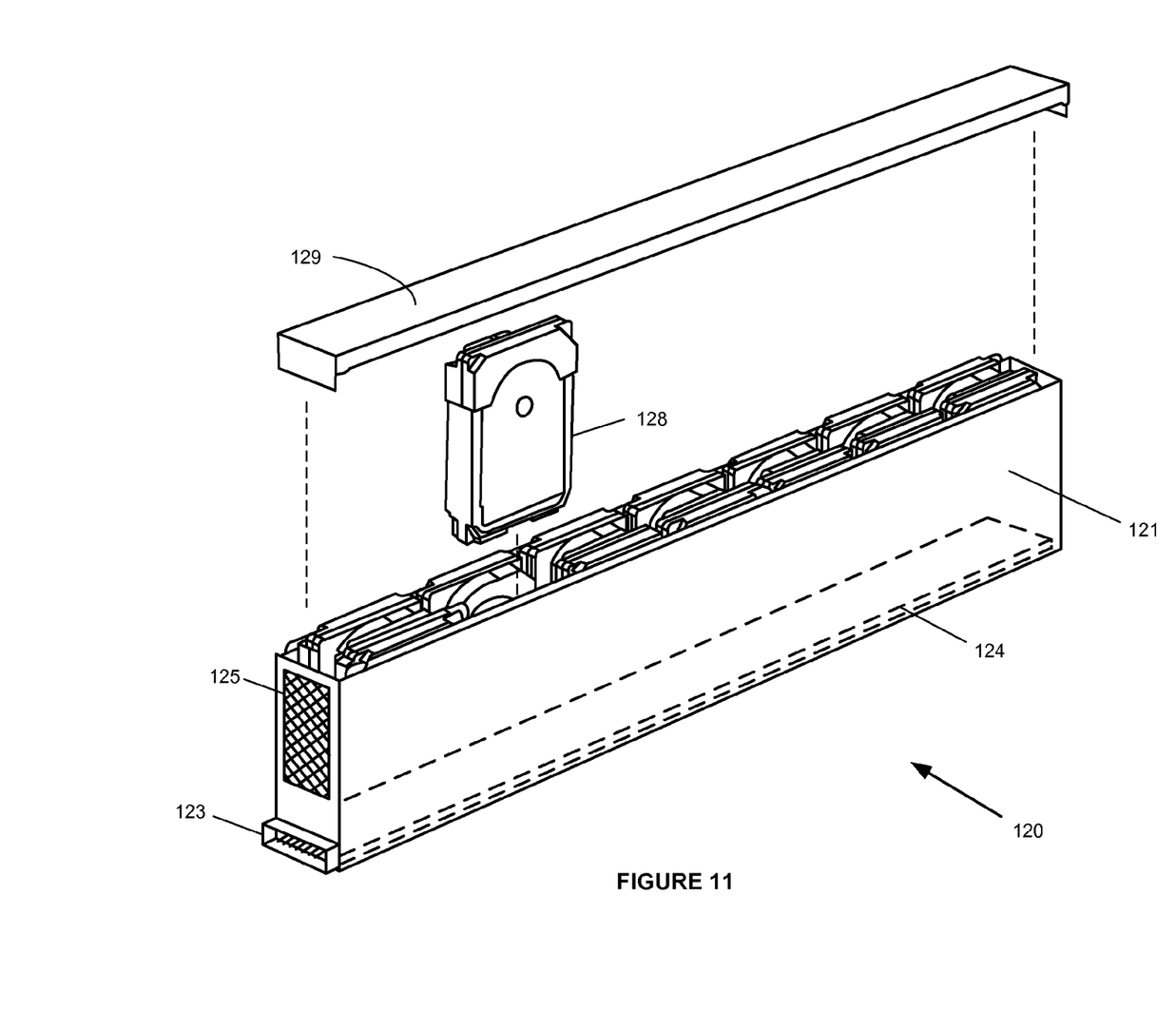
FIG. 11 shows detail of an exemplary mass storage sub-assembly.

FIG. 11 shows detail of an exemplary mass storage sub-assembly 120. The mass storage sub-assembly 120 includes a sub-assembly shell 121, the sub-assembly connector 123, a sub-assembly lid 129, and a plurality of storage drives 128 installed in the sub-assembly shell 121. In some examples, a storage drive comprises a digital storage device including one or more disk storage media, such as a hard disk drive (HDD). In addition, a storage drive can comprise a hybrid storage drive comprising one or more disk storage media combined with solid-state storage media.

The interior surface of the sub-assembly shell 121 can include any manner of guide or alignment mechanisms or features for receiving the plurality of storage drives 128. The interior surface of the sub-assembly shell 121 can include any manner of attachment or hold-down mechanisms or features for receiving the plurality of storage drives 128. It should be understood that the mass storage sub-assembly 120 can be used with any number of installed storage drives 128. Further, the exterior surface of the sub-assembly shell 121 can include mechanisms or features for installing the sub-assembly shell 121 into a mass storage chassis assembly 100 (or other receptacle or structure designed for receiving and operating mass storage sub-assemblies 120).

The sub-assembly shell 121 includes airflow windows 125 on the ends. The airflow windows 125 allow air to move lengthwise through the mass storage sub-assembly 120. The cooling airflow can travel around and/or through the individual storage drives 128 installed in the mass storage sub-assembly 120.

The sub-assembly connector 123 is affixed to a sub-assembly backplane 124 that extends along a bottom region of the sub-assembly shell 121 in the example shown. The sub-assembly connector 123 exchanges electrical signals for the mass storage sub-assembly 120, wherein digital data is stored on and retrieved from the mass storage sub-assembly 120. The sub-assembly connector 123 also provides electrical power to the mass storage sub-assembly 120. A plurality of backplane traces are coupled to the sub-assembly connector 123 and extend to connectors for each storage drive 128. The sub-assembly connector 123 can couple to a corresponding sub-assembly connector of the I/O module 115 when the mass storage sub-assembly 120 is installed into a mass storage chassis assembly 100.

While the present invention has been particularly shown and described with reference to the preferred implementations, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A cooling system adapted for use in a mass storage chassis assembly, comprising:
   a frame including one or more fan bays for receiving one or more fan units;
   one or more fan bay connectors located in the one or more fan bays and configured to couple to and provide electrical power to the one or more fan units;
   a plurality of retainer devices positioned in each fan bay, with the plurality of retainer devices configured to receive and hold a plurality of projections extending from each fan unit;
   wherein the one or more fan units are configured to be installed to the one or more fan bays, with each fan unit including a fan connector that couples to the corresponding fan bay connector; and
   further comprising one or more sub-assembly bay connectors located on the frame, with the one or more sub-assembly bay connectors corresponding to the one or more fan bays and the one or more fan bay connectors, with a fan bay connector being electrically coupled to a corresponding sub-assembly bay connector by an at least partially flexible conductor element.

2. The cooling system of claim 1, with the plurality of projections being frictionally retained in the plurality of retainer devices.

3. The cooling system of claim 1, with the plurality of retainer devices comprising a plurality of at least partially elastomeric retainer devices.

4. The cooling system of claim 1, with the plurality of projections of the fan unit comprising projection shafts or projection shafts with heads.

5. The cooling system of claim 1, with the plurality of projections of the fan unit comprising at least two projections located on an upper bay region of the fan bay and at least one projection located on a lower bay region of the fan bay.

6. The cooling system of claim 1, with the one or more fan units of the cooling system configured to be individually or collectively energized by an input/output (I/O) module of the mass storage chassis assembly.

7. The cooling system of claim 1, with the cooling system adapted for use in a tray rear region of the mass storage chassis assembly.

8. The cooling system of claim 1, with a first fan unit of the one or more fan units further comprising:
   a substrate;
   a handle affixed to the substrate;
   a plurality of airflow apertures in the substrate; and
   a fan affixed to the substrate, with the fan connector electrically coupled to the fan.

9. A cooling system comprising:
   a mass storage chassis assembly;
   a frame including one or more fan bays for receiving one or more fan units;
   one or more fan bay connectors located in the one or more fan bays and configured to couple to and provide electrical power to the one or more fan units;
   a plurality of retainer devices positioned in each fan bay, with the plurality of retainer devices configured to receive and hold a plurality of projections extending from each fan unit;
   wherein the one or more fan units are configured to be installed to the one or more fan bays, with each fan unit including a fan connector that couples to the corresponding fan bay connector; and
   further comprising one or more sub-assembly bay connectors located on the frame, with the one or more sub-assembly bay connectors corresponding to the one or more fan bays and the one or more fan bay connectors, with a fan bay connector being electrically coupled to a corresponding sub-assembly bay connector by an at least partially flexible conductor element.

10. The cooling system of claim 9, with the plurality of projections being frictionally retained in the plurality of retainer devices.

11. The cooling system of claim 9, with the plurality of retainer devices comprising a plurality of at least partially elastomeric retainer devices.

12. The cooling system of claim 9, with the plurality of projections of the fan unit comprising projection shafts or projection shafts with heads.

13. The cooling system of claim 9, with the plurality of retainer devices of the fan unit comprising at least two retainer devices located on an upper bay region of the fan bay and at least one retainer device located on a lower bay region of the fan bay.

14. The cooling system of claim 9, with the one or more fan units of the cooling system configured to be individually or collectively energized by an input/output (I/O) module of the mass storage chassis assembly.

15. The cooling system of claim 9, with the cooling system adapted for use in a tray rear region of the mass storage chassis assembly.

16. The cooling system of claim 9, with a first fan unit of the one or more fan units further comprising:
a substrate;
a handle affixed to the substrate;
a plurality of airflow apertures in the substrate; and
a fan affixed to the substrate, with the fan connector electrically coupled to the fan.

17. A mass storage chassis assembly, comprising:
a chassis tray configured to receive a plurality of mass storage sub-assemblies;
one or more mass storage sub-assemblies received in the chassis tray; and
a cooling system included in the chassis tray, with the cooling system comprising:
a frame including one or more fan bays for receiving one or more fan units;
one or more fan bay connectors located in the one or more fan bays and configured to couple to and provide electrical power to one or more fan units;
a plurality of retainer devices positioned in each fan bay, with the plurality of retainer devices configured to receive and hold a plurality of projections extending from each fan unit;
wherein the one or more fan units are configured to be installed to the one or more fan bays, with each fan unit including a fan connector that couples to the corresponding fan bay connector and including the plurality of projections; and
further comprising one or more sub-assembly bay connectors located on the frame, with the one or more sub-assembly bay connectors corresponding to the one or more fan bays and the one or more fan bay connectors, with a fan bay connector being electrically coupled to a corresponding sub-assembly bay connector by an at least partially flexible conductor element.

18. The mass storage chassis assembly of claim 17, with the plurality of projections being frictionally retained in the plurality of retainer devices.

19. The mass storage chassis assembly of claim 17, with the plurality of retainer devices comprising a plurality of at least partially elastomeric retainer devices.

20. The mass storage chassis assembly of claim 17, with the plurality of projections of the fan unit comprising projection shafts or projection shafts with heads.

21. The mass storage chassis assembly of claim 17, with the plurality of projections of the fan unit comprising at least two projections located on an upper bay region of the fan bay and at least one projection located on a lower bay region of the fan bay.

22. The mass storage chassis assembly of claim 17, with the one or more fan units of the cooling system configured to be individually or collectively energized by an input/output (I/O) module of the mass storage chassis assembly.

23. The mass storage chassis assembly of claim 17, with the cooling system adapted for use in a tray rear region of a mass storage chassis assembly.

24. The mass storage chassis assembly of claim 17, with a first fan unit of the one or more fan units further comprising:
a substrate;
a handle affixed to the substrate;
a plurality of airflow apertures in the substrate; and
a fan affixed to the substrate, with the fan connector electrically coupled to the fan.

25. A fan unit adapted for use in a mass storage chassis assembly, comprising:
a substrate;
a fan affixed to the substrate;
a plurality of projections extending from the fan unit, with the plurality of projections configured to be received and held by a corresponding plurality of retainer devices of a fan bay of the mass storage chassis assembly;
a fan connector extending from the fan unit; and
a sub-assembly bay comprising an at least partially flexible conductor element electrically coupled to the fan connector and configured to couple to a corresponding fan bay connector of the mass storage chassis assembly.

26. The fan unit of claim 25, with the plurality of projections being frictionally retained in the plurality of retainer devices.

27. The fan unit of claim 25, with the plurality of retainer devices comprising a plurality of at least partially elastomeric retainer devices.

28. The fan unit of claim 25, with the plurality of projections of the fan unit comprising projection shafts or projection shafts with heads.

29. A fan unit adapted for use in a mass storage chassis assembly, comprising:
a substrate;
a fan affixed to the substrate;
a plurality of retainer devices coupled to the fan unit, with the plurality of retainer devices configured to receive and hold a corresponding plurality of projections extending from a fan bay of the mass storage chassis assembly;
a fan connector extending from the fan unit; and
a sub-assembly bay comprising an at least partially flexible conductor element electrically coupled to the fan connector and configured to couple to a corresponding fan bay connector of the mass storage chassis assembly.

30. The fan unit of claim 29, with the plurality of projections being frictionally retained in the plurality of retainer devices.

31. The fan unit of claim 29, with the plurality of retainer devices comprising a plurality of at least partially elastomeric retainer devices.

32. The fan unit of claim 29, with the plurality of projections of the fan bay comprising projection shafts or projection shafts with heads.

* * * * *